(12) United States Patent
Nakamura et al.

(10) Patent No.: US 6,645,630 B1
(45) Date of Patent: Nov. 11, 2003

(54) EPOXY RESIN COMPOSITION, PREPREG AND MULTILAYER PRINTED-WIRING BOARD

(75) Inventors: Yoshihiko Nakamura, Kadoma (JP); Takuya Asano, Kadoma (JP); Kenji Ogasawara, Kadoma (JP); Naoki Ito, Kadoma (JP)

(73) Assignee: Matsushita Electric Works, Ltd., Kadoma (JP)

( * ) Notice: Subject to any disclaimer, the term of this patent is extended or adjusted under 35 U.S.C. 154(b) by 374 days.

(21) Appl. No.: 09/721,779

(22) Filed: Nov. 27, 2000

(30) Foreign Application Priority Data

Nov. 25, 1999 (JP) ............................................. 11-335085

(51) Int. Cl.⁷ ............................................. B32B 27/38
(52) U.S. Cl. ........................ 428/413; 428/417; 428/418; 428/901; 523/200; 524/401
(58) Field of Search ................................. 428/413, 417, 428/418, 901; 523/200; 524/401

(56) References Cited

U.S. PATENT DOCUMENTS 6,097,100 A * 8/2000 Eguchi et al. ............... 257/787
6,291,626 B1 * 9/2001 Wang et al. .................. 528/99
6,310,120 B1 * 10/2001 Shiobara et al. ............ 523/458
2002/0043728 A1 * 4/2002 Harada ....................... 257/787

\* cited by examiner

Primary Examiner—Robert Dawson
Assistant Examiner—Christopher M Keehan
(74) Attorney, Agent, or Firm—Oblon, Spivak, McClelland, Maier & Neustadt, P.C.

(57) ABSTRACT

An epoxy resin composition, which comprises, as an essential component, a phosphorus compound having an average of not less than 1.8 and less than 3 of phenolic hydroxy groups reactive with an epoxy resin and an average of not less than 0.8 of a phosphorus element in the molecule, an inorganic filler having an average particle diameter of not greater than 30 μm, a bifunctional epoxy resin having an average of not less than 1.8 and less than 2.6 of epoxy groups in the molecule and a hardener, wherein the bifunctional epoxy resin is contained at an amount of not less than 51% by mass relative to the whole epoxy resin, at least one of dicyandiamide and a polyfunctional phenol system compound having an average of not less than 3 of phenolic hydroxy groups in the molecule is used as the hardener and a ratio (a/c) of equivalent (a) of a phenolic hydroxy group of the phosphorus compound and equivalent (c) of an epoxy group of the bifunctional epoxy resin is not less than 0.3 and less than 0.75, and wherein aluminium hydroxide is used as the inorganic filler, an amount of the inorganic filler to be added is not less than 15 parts by mass and less than 100 parts by mass relative to 100 parts by mass of the resin solids constituent, and the content of a phosphorus element is not less than 0.8% by mass and less than 3.5% by mass relative to the whole resin solids constituent.

35 Claims, No Drawings

EPOXY RESIN COMPOSITION, PREPREG AND MULTILAYER PRINTED-WIRING BOARD

BACKGROUND OF THE INVENTION

1. Field of the Invention

The present invention relates to an epoxy resin composition for a prepreg used for manufacturing a printed-wiring board or a multilayer printed-wiring board, a prepreg, and a multilayer printed-wiring board.

2. Description of the Background Art

A nonflammable epoxy resin is used in a variety of electrical insulating materials due to the excellent self-extinguishing property, mechanical property, water-vapor resistance and electrical property.

The previous nonflammable epoxy resins contain a halogen system compound including mainly bromine in order to impart nonflammability and this affords the self-extinguishing property to molded particles. However, when such the molded articles burn upon firing or the like, there is a possibility that compounds harmful to the human body such as polybrominated dibenzodioxin, furan and the like are formed. Moreover, when compounds containing bromine are heated, bromine is released by decomposition and, thus, the heat resistance in long term is deteriorated. For that reason, there is desired development of molded articles having the excellent nonflammability and heat resistance without adding a halogen system compound.

As a strategy to this problem, flame-retardation using mainly a phosphorus element is being studied. For example, by incorporating an addition-type phosphorus system flame-retardant such as triphenyl phosphate (TPP), tricresyl phosphate (TCP), cresyldiphenyl phosphate (CDP) and the like which are a phosphate system compound into an epoxy resin composition, the nonflammability can be maintained. However, since general phosphorus compounds described above do not react with an epoxy resin, other problems arise that the solder heat resistance after moisture absorption and the resistance to chemicals such as the alkali resistance and the like of molded articles are significantly reduced.

Then, as disclosed in JP-A 4-11662, JP-A 11-166035 and JP-A 11-124489, the use of phosphorus compounds having the reactivity with an epoxy resin is proposed. However, even when these phosphorus compounds are used, the properties such as the solder heat resistance after moisture absorption and the like are not sufficient as compared with previous nonflammable epoxy resins using a halogen system compound. In addition, even when widely used general resins such as bisphenol A-type epoxy resin are used, a glass transition temperature (hereinafter, referred to as Tg) of a molded article is lowered and, furthermore, in the case of a printed-wiring board and a multilayer printed-wiring board using this molded article, the adhering force between layers of a laminated sheet or to a copper foil of an inner layer substrate is reduced.

One reason why more excellent solder heat resistance over the previous one is required in addition to nonflammability is a problem of today's earth environment. That is, release of lead used in a solder material into the natural environment has become a serious problem and, as one strategy thereto, the use of a lead-free solder has been initiated. Pursuant to this, a solder treating temperature is elevated higher by about 10 to 15° C. than the previous temperature and, thus, there arises a difficulty that the aforementioned techniques can not deal therewith.

The present invention was done in view of the above problems and an object thereof is to provide an epoxy resin composition for a prepreg used in manufacturing a printed-wiring board and a multilayer printed-wiring board which do not produce harmful substances upon burning, are excellent in the nonflammability, the solder heat resistance after moisture absorption and the adherability and has a high Tg at molding, a prepreg and a multilayer printed-wiring board.

SUMMARY OF THE INVENTION

An epoxy resin composition relating to the present invention is an epoxy resin composition comprising, as an essential component, a phosphorus compound having an average of not less than 1.8 and less than 3 of phenolic hydroxy groups reactive with an epoxy resin and an average of not less than 0.8 of a phosphorus element in the molecule, an inorganic filler having an average particle diameter of not greater than 30 μm, a bifunctional epoxy resin having an average of not less than 1.8 and less than 2.6 of epoxy groups in the molecule and a hardener, wherein the bifunctional epoxy resin is contained at an amount of not less than 51% by mass relative to the whole epoxy resin, dicyandiamide is used as the hardener and a ratio (a/c) of equivalent (a) of a phenolic hydroxy group of the phosphorus compound and equivalent (c) of an epoxy group of the bifunctional epoxy resin is not less than 0.3 and less than 0.75, and an epoxy resin composition relating to the present invention is an epoxy resin composition comprising, as an essential component in the molecule, a phosphorus compound having an average of not less than 1.8 and not less 3 of phenolic hydroxy groups reactive with an epoxy resin and an average of not less than 0.8 of a phosphorus element, an inorganic filler having an average particle diameter of not greater than 30 μm, a bifunctional epoxy resin having an average of not less than 1.8 and less than 2.6 of epoxy groups in the molecule and a hardener, wherein the bifunctional epoxy resin is contained at an amount of not less than 51% by mass relative to the whole epoxy resin, a polyfunctional phenol system compound having an average of not less than 3 phenolic hydroxy groups in the molecule is used as the hardener and a ratio (a/c) of equivalent (a) of a phenolic hydroxy group of the phosphorus compound and equivalent (c) of an epoxy group of the bifunctional epoxy resin is not less than 0.3 and less than 0.75.

DETAILED DESCRIPTION OF THE INVENTION

Embodiments of the present invention will be explained below.

A phosphorus compound in the present invention is not particularly limited as long as it has an average of not less than 1.8 and less than 3 of phenolic hydroxy groups reactive with an epoxy resin and an average of not less than 0.8 of a phosphorus element in the molecule. When such the phosphorus compound having a bifunctional phenolic hydroxy group and a bifunctional epoxy resin described below are reacted, a linear polymer compound can be obtained. And, when this compound is cured with a hardener described below, a molded article having the excellent toughness, flexibility, adherability and stress relaxation upon heating can be obtained. Here, when the number of phenolic hydroxy groups is an average of less than 1.8, it becomes difficult to react with a bifunctional epoxy resin to produce the aforementioned linear polymer compound. On the other hand, when the number of phenolic hydroxy groups is an average of not less than 3, a product by a reaction with a bifunctional epoxy resin is gelatinized and, thus, it becomes difficult to stably manufacture an epoxy resin composition. In addition, when the number of a phosphorus element is less than 0.8, it becomes difficult to impart the sufficient nonflammability.

As an example of a phosphorus compound, phosphorus compounds having a bifunctional phenolic hydroxy group represented by the formula (1) to (3) are preferable and these are particularly excellent in the nonflammability, the heat resistance and the like.

Here, a ratio (a/c) of equivalent (a) of a phenolic hydroxy group of a phosphorus compound and equivalent (c) of an epoxy group of a bifunctional epoxy resin is set at not less than 0.3 and less than 0.75. By setting like this, the aforementioned linear polymer compound can be sufficiently produced and, as a result, a molded article having the excellent toughness, flexibility, adherability and stress relaxation upon heating can be obtained. To the contrary, when this ratio is less than 0.3, such properties can not be obtained. When the ratio is not less than 0.75, Tg tends to be lowered.

Furthermore, it is preferable to set the content of a phosphorus element component at not less than 0.8% by mass and less than 3.5% by mass of the whole resin solids constituent in an epoxy resin composition and, by setting like this, the sufficient nonflammability can be maintained without adding a halogen compound. To the contrary, when the content is less than 0.8% by mass, there is a possibility that it becomes difficult to obtain the sufficient nonflammability. When the content is not less than 3.5% by mass, there is a possibility that increase in moisture absorption and decrease in the heat resistance tend to occur.

Next, an inorganic filler is not particularly limited as long as it has an average particle diameter of not greater than 30 $\mu$m. By adding such the inorganic filler to an epoxy resin composition, water absorption can be reduced, the strength upon heating at an elevated temperature such as solder treatment or the like can be increased, and a dimensional change rate upon heating can be reduced. Further, such the fine inorganic filler can improve the transparency of a molded article and, for this purpose, when an inorganic filler having an average particle diameter of not greater than 5 $\mu$m is used, the better effects can be expected. To the contrary, when an average particle diameter exceeds 30 $\mu$m, the transparency of a molded article is reduced, the electrical insulating properties are reduced and, further, the stress relaxation effect becomes uniform and, thus, the solder heat resistance after moisture absorption is reduced. In addition, a lower limit of an average particle diameter is 0.05 $\mu$m and, when the diameter is less than 0.05 $\mu$m, there is a possibility that the viscosity of an epoxy resin composition is increased.

As an example of an inorganic filler, metal hydroxides such as aluminum hydroxide, magnesium hydroxide and the like are preferable and these can make a contribution to the nonflammability in addition to the aforementioned effects.

Here, it is preferable to set an amount of the inorganic filler to be added at not less than 15 parts by mass and less than 100 parts by mass relative to 100 parts by mass of resin solids constituents and, by setting like this, water absorption can be reduced, the strength upon heating at an elevated temperature such as solder treatment and the like can be increased, and dimensional change rate upon heating can be reduced. In addition, it is preferable to add an amount of not less than 35 parts by mass. To the contrary, when an amount to be added is less than 15 parts by mass, there is a possibility that water absorption is increased, the solder heat resistance is reduced, and dimensional change rate upon heating is increased. When the amount is not less than 100 parts by mass, it is difficult to disperse a filler uniformly and there is a possibility that the adhering force is reduced.

Further, it is preferable that the surface of an inorganic filler to be added to an epoxy resin composition is treated with an epoxysilane coupling agent or a mercaptosilane coupling agent. When an inorganic filler is subjected to the surface treatment like this, the adhering force to a resin can be strengthened and, further, the properties of an inorganic filler itself can be improved. That is, although aluminum hydroxide and magnesium hydroxide do not have sufficient resistance to chemicals, they can improve resistance to chemicals by the surface treatment. When an epoxysilane coupling agent or a mercaptosilane coupling agent is used for this surface treatment, the properties such as resistance to chemicals and the like can be improved and, at the same time, an inorganic filler can be dispersed uniformly in an epoxy resin composition while inhibiting secondary aggregation of the inorganic filler. Here, as an example of the epoxysilane coupling agent, there are $\gamma$-glycidoxypropyltrimethoxysilane and $\gamma$-glycidoxypropylmethyldimethoxysilane. As an example of the mercaptosilane coupling agent, there are $\gamma$-mercaptopropyltrimethoxysilane and $\gamma$-mercaptopropyltriethoxysilane.

In addition, an epoxy resin is not particularly limited as long as it is a bifunctional epoxy resin having an average of not less than 1.8 and less than 2.6 of epoxy groups in the molecule. When the number of epoxy groups is an average of less than 1.8, it becomes difficult to react with the aforementioned phosphorus compound to produce a linear polymer compound. On the other hand, the number is an average of not less than 2.6, it becomes difficult to stably produce an epoxy resin composition because a reaction product with a phosphorus compound is gelatinized.

As an example of an epoxy resin, bifunctional epoxy resins represented by the formulas (4) to (7) are preferable. When these are used, Tg of a molded article can be heightened and, at the same time, the strength upon heating at an elevated temperature becomes better due to stiffness. Therefore, when a printed-wiring board or a multilayer printed-wiring board using epoxy resin composition having such properties is manufactured, the adhering force to a metal foil such as a copper foil is not reduced and the electrical conductivity reliance of a through-hole can be sufficiently maintained in spite of a temperature change after processing of a through-hole.

In addition, among examples of the aforementioned epoxy resin, since bifunctional epoxy resins represented by the formulas (4) to (6) have a high carbon rate in a resin skeleton, name retardation of these bifunctional epoxy resins can be particularly easily attained by the addition of a phosphorus compound.

Here, a bifunctional epoxy resin is contained at an amount of not less than 51% by mass relative to the whole epoxy resin and this can improve toughness and the like. To the contrary, when the content is less than 51% by mass, the adhering force is reduced and the solder heat resistance is reduced.

In addition, as a hardener, dicyandiamide or a polyfunctional phenol system compound having an average of not less than 3 of phenolic hydroxy groups in the molecule is used. These can impart the better electrical properties and, at the same time, harden a linear polymer compound which is a reaction product of the aforementioned phosphorus compound having a bifunctional phenolic hydroxy group and a bifunctional epoxy resin and, thus, a molded article having the excellent toughness, flexibility, adherability and stress relaxation upon heating can be obtained. In addition, when a polyfunctional phenol compound has an average of less than 3 of phenolic hydroxy groups, it becomes a hardened compound having low Tg.

Other epoxy resins, additives and various modifiers may be incorporated into an epoxy resin composition in addition to the aforementioned essential components, as necessary.

For example, as other epoxy resins, bifunctional epoxy resins such as bisphenol A-type epoxy resin, bisphenol F-type epoxy resin and the like, and polyfunctional epoxy resins such as phenol novolak-type epoxy resin, cresol novolak-type epoxy resin, bisphenol A novolak-type epoxy resin, bisphenol F novolak-type epoxy resin, naphthalene-type epoxy resin, biphenyl-type epoxy resin, dicyclopentadiene-type epoxy resin and the like can be used alone or in combination of a plurality of them. Provided that, general-purpose novolak-type epoxy resin hardens a molded article after curing and is inferior in toughness and the like and, when a polyfunctional epoxy resin is used together, it is desirable to use a polyfunctional epoxy resin with toughness imparted thereto.

In addition, as a hardening promotor, tertiary amines and imidazoles may be added.

In addition, as a reforming agent, a rubber component such as polyvinylacetal resin, SBR, BR, butyl rubber, butadiene-acrylonitrile copolymer rubber and the like may be incorporated.

And, an epoxy resin composition relating to the present invention can be manufactured by two processes described below.

According to the first manufacturing process, the aforementioned phosphorus compound, inorganic filler, epoxy resin and hardener as an essential component and, if necessary, other components can be mixed uniformly with a mixer, a blender or the like to manufacture an epoxy resin composition.

According to the second manufacturing process, first, all or a part of a bifunctional epoxy resin and all of a phosphorus compound having a bifunctional phenolic hydroxy group are heated and reacted using tertiary amines or triphenylphosphines. Upon this, not less than 80%, more preferably not less than 95% of phenolic hydroxy groups of a phosphorus compound are reacted with an epoxy group of a bifunctional epoxy resin. The resin thus produced is referred to as "pre-reacted epoxy resin".

Next, an inorganic filler, a hardener and, if necessary, a phosphorus compound, an epoxy resin and other components are incorporated into this pre-reacted epoxy resin, which can be uniformly mixed with a mixer, a blender or the like to manufacture an epoxy resin composition.

In addition, in any aforementioned manufacturing processes, a solvent may be or may not be used.

Here, an epoxy resin composition relating to the present invention is preferably manufactured according to the second manufacturing process as compared with the first manufacturing process. This is based on the following reasons. That is, when the aforementioned phosphorus compound having a bifunctional phenolic hydroxy group and the bifunctional epoxy resin are not reacted, it is likely to reduce the solder heat resistance after moisture absorption and the resistance to chemicals. For this reason, it is necessary to sufficiently react both of them. However, in the first manufacturing process, it is difficult to react only these two component because other components are present in some cases. Then, by reacting only these two component in advance, a linear polymer compound is assuredly produced. In addition, both of them have a bifunctional group, a prereacted epoxy resin can be stably manufactured without gelation.

And, a prepreg in the semi-hardened state (B-stage) can be manufactured by preparing a varnish using the epoxy resin composition prepared by the aforementioned manufacturing process, impregnating a substrate with the varnish, and drying the substrate at 120 to 190° C. for 3 to 15 minutes in a dryer. As a substrate, a glass fiber cloth such as a glass cloth, a glass paper, a glass mat and the like, a kraft paper, a linter paper, a natural fiber cloth, an organic synthetic fiber cloth and the like can be used.

A laminated sheet can be manufactured by stacking a required number of prepregs thus manufactured and heating and pressing them under the conditions of 140 to 200° C. and 0.98 to 4.9 MPa. Upon this, a metal foil-clad laminated sheet can be manufactured by overlaying a metal foil on one side or both sides of a stack of a required number of prepregs and heating and pressing the prepregs and the metal foil. As this metal foil, a copper foil, a silver foil, an aluminum foil, a stainless foil and the like can be used. In addition, a multilayer laminated sheet can be manufactured by placing a prepreg on an upper side and a lower side of an inner layer substrate on which a circuit pattern is pre-formed, overlaying a metal foil on one side or both sides of a stack of a required number of prepregs, and heating and pressing the prepregs and the metal foil. In addition, upon manufacturing a multilayer laminated sheet, it is preferable to set a molding temperature in a range of 150 to 180° C.

When a molding temperature is lower than 1 50° C., there is a possibility that hardening is insufficient, it becomes difficult to obtain the desired heat resistance, and the adhering force between a prepreg and a copper foil of an inner layer substrate becomes insufficient. When the temperature is higher than 180° C., the irregular surface of a copper foil of an inner layer substrate which has been chemically treated in advance is disappeared, and there is a possibility that the adhering force between a prepreg and a copper foil of an inner layer substrate becomes insufficient.

EXAMPLES

The following Examples illustrate the present invention more specifically.

First, an epoxy resin, a hardener, a phosphorus compound, a coupling agent, an inorganic filler and a solvent used are shown below in this order.

As an epoxy resin, the following 8 kinds were used.

Epoxy Resin 1: Biphenyl-type Bifunctional Epoxy Resin "YL6121" manufactured by Yukashell Epoxy (K.K.)

A mixture of an epoxy compound of the formula (4) wherein n is 0 and an epoxy compound of the formula (4) wherein n is 1.

(Number of epoxy groups: Average 2.0, epoxy equivalent 172)

Epoxy Resin 2: Tetramethylbiphenyl-type Bifunctional Epoxy Resin "YX4000H" Manufactured by Yukashell Epoxy (K.K.)

An epoxy compound of the formula (4) wherein n is 1.

(Number of epoxy groups: Average 2.0, epoxy equivalent 195)

Epoxy Resin 3: Naphthalene-type Bifunctional Epoxy Resin "EPICLON-HP4032" manufactured by Dainihonink (K.K.)

The following formula (8)

(Number of epoxy groups: Average 2.0, epoxy equivalent 150)

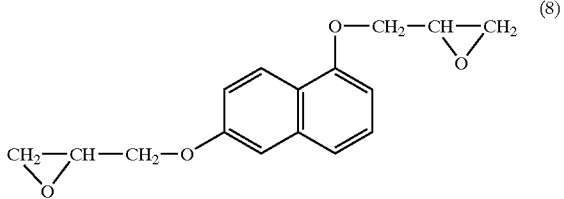

Epoxy Resin 4: A Bifunctional Epoxy Resin of the Formula (6)

"LVX210" manufactured by Sumitomo Chemical Co., Ltd.

(Number of epoxy groups: Average 1.9, epoxy equivalent 208)

Epoxy Resin 5: A Dicyclopentadiene-containing Bifunctional Epoxy Resin of the Formula (7)

"ZX-1257" manufactured by Totokasei (K.K.)

(Number of epoxy groups: Average 2.0, epoxy equivalent 257)

Epoxy Resin 6: Phenol Novolak-type Epoxy Resin "EPICLO-N770" manufactured by Dainihonink (K.K.)

The following formula (9)

(Number of epoxy groups: Average 5.0, epoxy equivalent 190)

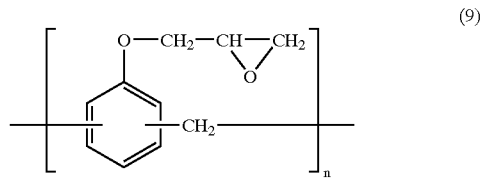

Epoxy Resin 7: Non-novolak-type Special Polyfunctional Epoxy Resin

"EPPN502H" (softening point about 70° C.) manufactured by Nippon Kayaku Co., Ltd.

The following formula (10)

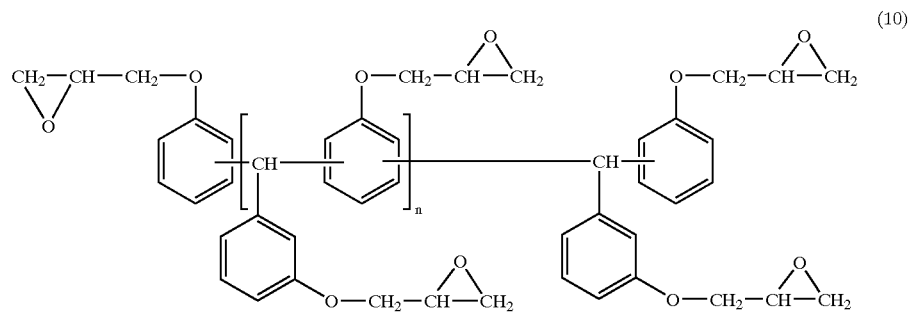

(Number of epoxy groups: Average 7.0, epoxy equivalent 170)

Epoxy Resin 8: Bisphenol A-type Bifunctional Epoxy Resin "EPICOAT 828" manufactured by Yukashell Epoxy (K.K.) The following formula (11)

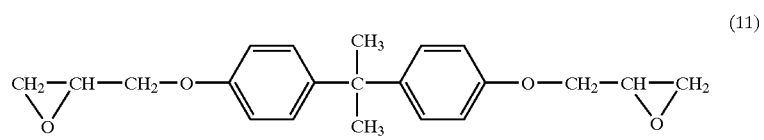

(Number of epoxy groups: Average 2.0, epoxy equivalent 190)

As a hardener, the following two kinds were used.

Hardener 1: Dicyandiamide (Molecular weight 84, theoretical active hydrogen equivalent 21)

Hardener 2: Phenol Novolak Resin

"PSM 6200" manufactured by Gun-ei Chemicals Co., Ltd.

(Melting point about 80° C., hydroxy equivalent 105)

As a phosphorus compound, the following four kinds were used.

Phosphorus Compound 1: Compound of the Formula (12) Having an Average of 2.0 of Phenolic Hydroxy Groups "HCA-HQ" manufactured by Sanko (K.K.) (Phosphorus content about 9.6% by mass, hydroxy group equivalent about 162)

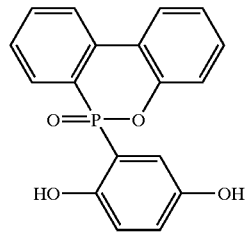
(12)

Phosphorus compound 2: Compound of the Formula (13) Having an Average of 2.0 of Phenolic Hydroxy Groups "HCA-NQ" manufactured by Sanko (K.K.) (Phosphorus content about 8.2% by mass, hydroxy group equivalent about 188)

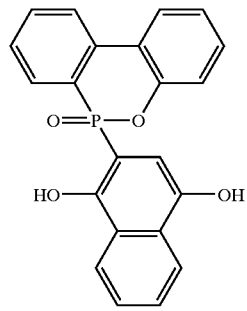
(13)

Phosphorus Compound 3: Compound of the Formula (14) Having an Average of 2.0 of Phenolic Hydroxy Groups (Diphenylphosphinylhydroquinone)

"PPQ" manufactured by Hokko Chemicals Co., Ltd. (Phosphorus content about 10.1% by mass, hydroxy group equivalent about 155)

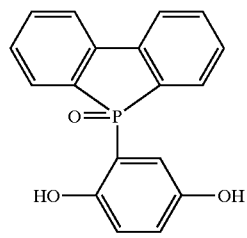
(14)

Phosphorus Compound 4: Non-reactive Phosphorus Compound Having no Phenolic Hydroxy Group "ADECASTAB PFR" manufactured by Asahi Denka Kogyo K.K.

(Phosphorus content about 9.8% by mass)

In addition, as a coupling agent, the following three kinds were used.

Coupling Agent 1: Epoxysilane Coupling Agent (γ-glycidoxypropyltrimethoxysilane)

"KBM403" manufactured by Shin-Etsu Chemical Co., Ltd.

Coupling Agent 2: Mercaptosilane Coupling Agent
(γ-mercaptopropyltrimethoxysilane)
"TSL8380" manufactured by Toshiba Silicone (K.K.)
Coupling Agent 3: Aminosilane Coupling Agent
(γ-aminopropyltrimethoxysilane)
"KBM903" manufactured by Shin-Etsu Chemical Co., Ltd.

In addition, as an inorganic filler, the following nine kinds were used.

Inorganic Filler 1: High Purity Aluminum Hydroxide
"HYZILIDE H42M" manufactured by Showa Denko K.K.
(Average particle diameter about 1 μm)
Inorganic Filler 2: High Purity Aluminum Hydroxide
"C302A" manufactured by Sumitomo Chemical Co., Ltd.
(Average particle diameter about 2 μm)
Inorganic Filler 3: Aluminum Hydroxide
"C315" manufactured by Sumitomo Chemical Co., Ltd.
(Average particle diameter about 15 μm)
Inorganic Filler 4: Aluminum Hydroxide
"C3 1" manufactured by Sumitomo Chemical Co., Ltd.
(Average particle diameter about 50 μm)
Inorganic Filler 5: High Purity Aluminum Hydroxide
"KISMA5" manufactured by Kyowakagaku (K.K.)
(Average particle diameter about 1 μm)
Inorganic filler 6: Inorganic filler 1 (100 parts by mass) surface-treated with a coupling agent 1 (about 1.5 parts by mass) by a dry process Inorganic filler 7: Inorganic filler 1 (100 parts by mass) surface-treated with a coupling agent 2 (about 1.5 parts by mass) by a dry process Inorganic filler 8: Inorganic filler 1 (100 parts by mass) surface-treated with a coupling agent 3 (about 1.5 parts by mass) by a dry process Inorganic filler 9: Talc
"LMP100" manufactured by Fujitalc (K.K.)
(Average particle diameter about 3 μm)
In addition, as a solvent, the following three kinds were Used.

Solvent 1: Methyl ethyl ketone (MEK)
Solvent 2: Methoxypropanol (MP)
Solvent 3: Dimethylformamide (DMF)

And, 8 kinds of a pre-reacted epoxy resin were prepared using the aforementioned epoxy resin, phosphorus compound and the like.

(Pre-reacted Epoxy Resin 1)

An epoxy resin 1 (70 parts by mass) and a phosphorus compound 1 (30 parts by mass) were heated and stirred in a solvent 2 (20 parts by mass) at 130° C. and, thereafter, 0.2 part by mass of triphenylphosphine was added, and heat-stirring was continued for about 3 hours to obtain a pre-reacted epoxy resin 1 having an epoxy equivalent in solids constituent of 455, solids constituent of 83.33% by mass and the phosphorus content in solids constituent of about 2.9% by mass.

(Pre-reacted Epoxy Resin 2)

An epoxy resin 2 (70 parts by mass) and a phosphorus compound 1 (30 parts by mass) were heated and stirred without a solvent at 130° and, thereafter, 0.2 part by mass of triphenylphosphine was added, and heat-stirring was continued for about 4 hours to obtain a pre-reacted epoxy resin 2 having an epoxy equivalent of about 575, a melt viscosity at 150° C. of about 100 poise and the phosphorus content of about 2.9% by mass.

(Pre-reacted Epoxy Resin 3)

An epoxy resin 3 (70 parts by mass) and a phosphorus compound 1 (30 parts by mass) were heated and stirred without a solvent at 130° C. and, thereafter, 0.2 part by mass of triphenylphosphine was added, and heat-stirring was continued for about 3 hours to obtain a pre-reacted epoxy resin 3 having an epoxy equivalent of about 361, a melt viscosity at 150° C. of about 80 poise and the phosphorus content of about 2.9% by mass.

(Pre-reacted Epoxy Resin 4)

An epoxy resin 4 (70 parts by mass) and a phosphorus compound 1 (30 parts by mass) were heated and stirred without a solvent at 130° C. and, thereafter, 0.2 part by mass of triphenylphosphine was added, and heat-stirring was continued for about 4 hours to obtain a pre-reacted epoxy resin 4 having an epoxy equivalent of about 680, a melt viscosity at 150° C. of about 200 poise and the phosphorus content of about 2.9% by mass.

(Pre-reacted Epoxy Resin 5)

An epoxy resin 5 (70 parts by mass) and a phosphorus compound 1 (30 parts by mass) were heated and stirred without a solvent at 130° C. and, thereafter, 0.2 part by mass of triphenylphosphine was added, and heat-stirring was continued for about 3 hours to obtain a pre-reacted epoxy resin 5 having an epoxy equivalent of about 1220, a melt viscosity at 150° C. of about 280 poise and the phosphorus content of about 2.9% by mass.

(Pre-reacted Epoxy Resin 6)

An epoxy resin 2 (70 parts by mass) and a phosphorus compound 2 (30 parts by mass) were heated and stirred without a solvent at 130° C. and, thereafter, 0.2 part by mass of triphenylphosphine was added, and heat-stirring was continued for about 4 hours to obtain a pre-reacted epoxy resin 6 having an epoxy equivalent of about 562, a melt viscosity at 150° C. of about 500 poise and the phosphorus content of about 2.5% by mass.

(Pre-reacted Epoxy Resin 7)

An epoxy resin 2 (70 parts by mass) and a phosphorus compound 3 (30 parts by mass) were heated and stirred without a solvent at 130° C. and, thereafter, 0.2 part by mass of triphenylphosphine was added, and heat-stirring was continued for about 3 hours to obtain a pre-reacted epoxy resin 7 having an epoxy equivalent of about 592, a melt viscosity at 150° C. of about 340 poise and the phosphorus content of about 3.0% by mass.

(Pre-reacted Epoxy Resin 8)

An epoxy resin 2 (60 parts by mass) and a phosphorus compound 1 (40 parts by mass) were heated and stirred without a solvent at 130° C. and, thereafter, 0.2 part by mass of triphenylphosphine was added, and heat-stirring was continued for about 3 hours to obtain a pre-reacted epoxy resin 8 having an epoxy equivalent of about 1632, a melt viscosity at 150° C. of about 840 poise and the phosphorus content of about 3.9% by mass.

And, upon preparation of an epoxy resin composition using the above materials as a raw material, the aforementioned two kinds of manufacturing processes were adopted. The first manufacturing process expressed by A process and the second manufacturing process expressed by B process will be explained below.

(A Process)

A phosphorus compound, an inorganic filler, an epoxy resin, a hardener and other additives were placed in the predetermined solvent and mixed with "Homomixer" manufactured by Tokushukikakokogyo at about 1000 rpm for about 90 minutes. Then, a hardening promotor (2-ethyl-4-methylimidazole) was blended, stirred again for about 15 minutes and, thereafter, degassed to obtain an epoxy resin composition having the viscosity of about 5–10 poise at 250° C.

(B Process)

A pre-reacted epoxy resin was first prepared in advance as described above and, then, this pre-reacted epoxy resin, an inorganic filler, a hardener and, if necessary, a phosphorus compound, an epoxy resin and other additives were placed in the predetermined solvent, and mixed with "Homomixer" manufactured by Tokushukikakokogyo at about 1000 rpm for about 90 minutes. Then, a hardening promotor (2-ethyl-4-methylimidazole) was blended, stirred again for about 15 minutes and, thereafter, degassed to obtain an epoxy resin composition having the viscosity of about 5–10 poise at 25° C.

By applying A process or B process like this, epoxy resin compositions of Examples 1 to 25 and Comparative Examples 1 to 9 were obtained from the formulation shown in Table 1 to Table 7. And the epoxy resins were used to manufacture a prepreg, a copper-clad laminated sheet and a multilayer sheet.

Process for Preparing a Prepreg

The epoxy resin composition prepared by A process or B process was prepared into a varnish, and a glass cloth ("WEA7628" manufactured by Nitto Boseki Co., Ltd., glass cloth having a thickness of 0.18 mm) was impregnated with the varnish, which was dried in a dryer at a range of 120 to 190° C. for around 5 to 10 minutes to obtain a prepreg in the semi-hardened (B-stage) state.

Process for Preparing a Copper-clad Laminated Sheet

Four prepregs prepared as described above were stacked, a copper foil was further overlaid on both sides of the prepregs, which was heated and pressed under the conditions of 140 to 180° C. and 0.98 to 3.9 MPa to manufacture a copper-clad laminated sheet of about 0.75 mm. Here, a heating time was set such that a time during which the whole prepreg was 160° C. or higher was at least 60 minutes or longer. In addition, upon this, it was set such that the interior of the prepreg was under reduced pressure of 133 hPa or lower. This is because, by such the procedures, adsorbed water can be effectively removed and voids after molding can be prevented from remaining after molding. As a copper foil, "GT" thickness 0.018 mm) manufactured by Furukawa Circuit Foil (K.K.) was used.

Process for Manufacturing a Multilayer Laminated Sheet

In addition, a copper foil (thickness 35 $\mu$m) in which a pattern had been formed on an inner layer substrate ("CR1766" manufactured by Matsushita Electric Works, Ltd., thickness 0.2 mm) was subjected to the following blacking process, then a prepreg was placed on an upper side and a lower side of this inner layer substrate one by one and, further, copper foil was overlaid on both prepreg, which was molded under the above molding conditions to manufacture a multilayer laminated sheet.

Treatment of a Copper Foil of an Inner Layer Substrate (Blacking Process)

Sodium chlorite, sodium hydroxide and trisodium phosphate were mixed so that each concentration became 50 g/l, 10 g/l and 10 g/l, respectively, to prepare an aqueous solution. This aqueous solution was used as treating water for copper foil treatment (blacking process) to treat a copper foil of an inner layer substrate at 95° C. for 60 seconds.

And, the molded articles thus obtained were evaluated for the physical properties as follows:

(1) Adhering Force After Blacking Process

The adhering force to the blacking process-treated copper foil for an inner layer substrate was evaluated at 25 ° C. by a 90 degree peel test according to JIS-C6481.

(2) Nonflammability, Average Seconds to Flame-out

A copper foil on the surface was removed from a copper-clad laminated sheet by etching, which was cut into a length of 125 mm and a width of 13 mm, and a test on burning behavior was performed according to Under Writers Laboratories "Test for Flammability of Plastic Materials-UL94". In addition, in order to see the difference in flame-out property, an average time from ignition to flame-out was measured.

(3) Water Absorption

A copper foil was removed from a copper-clad laminated sheet as in (2), which was cut into 50 mm cube, which was boiled at 100° C. for 2 hours and a water absorption was measured. A water absorption was calculated according to the following equation. Water absorption (%)=((Mass after water absorption—mass before water absorption)/mass before water absorption)×100.

(4) Glass Transition Temperature (Tg)

A copper foil was removed from a copper-clad laminated sheet as in (2), which was cut into a length of 30 mm and a width of 5 mm, and tan was measured with a viscoelasticity spectrometer apparatus to obtain a peak temperature which was adopted as Tg.

(5) Boiling Solder Heat Resistance

A copper foil was removed from a multilayer laminated sheet containing an inner layer substrate as in (2), which was cut into 50 mm cube. After four cubic samples were boiled at 100° C. for 2 hours, 4 hours and 6 hours, they were immersed in a solder bath at 265° C. for 20 seconds and, thereafter, the appearance abnormality such as blister was observed. The observation results are expressed by; no blister, ○: small blister, Δ: large blister, X.

(6) Thermal Coefficient of Expansion

A copper foil was removed from a copper-clad laminated sheet as in (2), which was cut into the suitable shape and the thermal coefficient of expansion in a thickness direction was measured with a linear thermal coefficient of expansion measuring apparatus (TMA).

(7) Transparency of a Molded Article

A copper foil was removed from a copper-clad laminated sheet as in (2), appearances of which were observed to evaluate the transparency of a laminated sheet. The observation results are expressed by; a glass cloth is clearly seen due to high transparency, ○: cloudy due to slightly bad transparency, Δ: a glass cloth is not seen due to bad transparency, X.

(8) Resistance to Chemicals of a Molded Article

A copper foil was removed from a copper-clad laminated sheet as in (2), which was immersed in an aqueous solution of sodium hydroxide (10% by mss) at 50° C. for 1 hour, and change in the appearances was observed. The observation results are expressed by; no change, ○: bad surface smoothness, Δ: bad surface smoothness and cloudy white, X.

The results of the foregoing physical properties evaluation are summarized in Table 1 to Table 7.

In Comparative Example 8 shown in Table 7, a phosphorus compound is not contained, and it can be seen that the nonflammability is remarkably reduced in this Comparative Example as compared with others. However, it can be seen that, when a phosphorus compound is contained but there is no phenolic hydroxy group reactive with an epoxy resin as in Comparative Example 9 shown in the same Table, the solder heat resistance and the resistance to chemicals are reduced.

In addition, as apparent from Comparative Examples 4, 5 and 7 shown in Table 6, it can be seen that, when a bifunctional epoxy resin is contained but its amount is small, it becomes difficult to impart toughness and flexibility and the adhering force and the solder heat resistance are reduced.

In addition, in Comparative Examples 1 and 3 shown in Table 6, an inorganic filler is not added and it can be seen that the solder heat resistance is remarkably reduced and the thermal coefficient of expansion is significantly increased as compared with others. However, when an inorganic filler is contained but its average particle diameter is greater than 30 μm as in Comparative Example 2 shown in the same Table, the above properties are not improved and other problem arises such as decrease in the transparency in a molded article.

From the foregoing, it can be seen that Examples shown in Table 1 to Table 5 are excellent as a whole in each physical property as compared with Comparative Examples shown in Tables 6 and 7.

As described above, since an epoxy resin composition of the present invention is an epoxy resin composition containing a phosphorus compound having an average of not less than 1.8 and less than 3 of phenolic hydroxy groups reactive with an epoxy group and an average of not less than 0.8 of a phosphorus element in the molecule, an inorganic filler having an average particle diameter of not greater than 30 μm, a bifunctional epoxy resin having an average of not less than 1.8 and less than 2.6 of epoxy groups in the molecule and a hardener as en essential component, wherein a bifunctional epoxy resin is contained at an amount of not less than 51% by mass relative to the whole epoxy resin, dicyandiamide is used as a hardener and, at the same time, a ratio (a/c) of equivalent (a) of a phenolic hydroxy group of a phosphorus compound and equivalent (c) of an epoxy group of a bifunctional epoxy resin is not less than 0.3 and less than 0.75, the nonflammability can be improved without necessity of containing a halogen system compound such as bromine and the like which is a cause for harmful substances produced at burning and, by reacting a phosphorus compound and a bifunctional epoxy resin with a hardener, molded articles with toughness and flexibility imparted thereto and having the excellent adhering force and solder heat resistance after moisture absorption can be obtained and, further, Tg, the transparency and resistance to chemicals of molded articles can be enhanced.

In addition, by using an epoxy resin composition containing a phosphorus compound having an average of not less than 1.8 and less than 3 of phenolic hydroxy groups reactive with an epoxy group and an average of not less than 0.8 of a phosphorus element in the molecule, an inorganic filler having an average particle diameter of not greater than 30 μm, a bifunctional epoxy resin having an average of not less than 1.8 and less than 2.6 of epoxy groups in the molecule and a hardener as an essential component, and incorporating a bifunctional epoxy resin at an amount of not less than 51% by mass relative to the whole epoxy resin, using a polyfunctional phenol system compound having an average of not less than 3 of phenolic hydroxy groups in the molecule as a hardener and, at the same time, using a ratio (a/c) of equivalent (a) of a phenolic hydroxy group of a phosphorus compound and equivalent (c) of an epoxy group of a bifunctional epoxy resin of not less than 0.3 and less than 0.75, the nonflammability can be improved without necessity of containing a halogen system compound such as bromine and the like which is a cause for harmful substances produced at burning and, by reacting a phosphorus compound and a bifunctional epoxy resin with a hardener, molded articles with toughness and flexibility imparted thereto and having the excellent adhering force and solder heat resistance after moisture absorption can be obtained and, further, Tg, the transparency and resistance to chemicals of molded articles can be enhanced.

In addition, by using a phosphorus compound represented by the formula (1) as a phosphorus compound, the nonflammability can be improved without necessity of containing a halogen system compound such as bromine and the like and, at the same time, a reaction with a bifunctional epoxy resin can be assuredly performed to produce a linear polymer compound and reduction of the solder heat resistance after moisture absorption and resistance to chemicals is avoided.

In addition, by using a phosphorus compound represented by the formula (2) as a phosphorus compound, the nonflammability can be improved without necessity of containing a halogen system compound such as bromine and the like and, at the same time, a reaction with a bifunctional epoxy resin can be assuredly performed to produce a linear polymer compound and reduction of the solder heat resistance after moisture absorption and resistance to chemicals is avoided.

In addition, by using a phosphorus compound represented by the formula (3) as a phosphorus compound, the nonflammability can be improved without necessity of containing a halogen system compound such as bromine and the like and, at the same time, a reaction with a bifunctional epoxy resin can be assuredly performed to produce a linear polymer compound and reduction of the solder heat resistance after moisture absorption and resistance to chemicals is avoided.

In addition, by using aluminum hydroxide as an inorganic filler, water absorption can be reduced and, thus, the solder heat resistance can be improved, the dimensional change rate upon heating can be reduced and, at the same time, it can contribute to the nonflammability.

In addition, by using magnesium hydroxide as an inorganic filler, water absorption can be reduced and, thus, the solder heat resistance can be improved, the dimensional change rate upon heating can be reduced and, at the same time, it can contribute to the nonflammability.

In addition, by adding an inorganic filler at an amount of not less than 15 parts by mass and less than 100 parts by mass relative to 100 parts by mass of the resin solids constituent, water absorption can be reduced and, thus, the solder heat resistance can be improved and, at the same time, the dimensional change rate upon heating can be reduced.

In addition, by using a biphenyl-type epoxy resin represented by the formula (4) as a bifunctional epoxy resin, a reaction with a phosphorus compound having a bifunctional phenolic hydroxy group can be performed to assuredly produce a linear polymer compound, the toughness and the flexibility can be imparted, and the adhering force and the solder heat resistance after moisture absorption can be improved.

In addition, by using a naphthalene-type epoxy resin represented by the formula (5) as a bifunctional epoxy resin, a reaction with a phosphorus compound having a bifunctional phenolic hydroxy group can be performed to assuredly produce a linear polymer compound, the toughness and the flexibility can be imparted, and the adhering force and the solder heat resistance after moisture absorption can be improved.

In addition, by using a special bifunctional epoxy resin represented by the formula (6) as a bifunctional epoxy resin, a reaction with a phosphorus compound having a bifunctional phenolic hydroxy group can be performed to assuredly produce a linear polymer compound, the toughness and the flexibility can be imparted, and the adhering force and the solder heat resistance after moisture absorption can be improved.

In addition, by using a special bifunctional epoxy resin represented by the formula (7) as a bifunctional epoxy resin, a reaction with a phosphorus compound having a bifunctional phenolic hydroxy group can be performed to assuredly produce a linear polymer compound, the toughness and the flexibility can be imparted, and the adhering force and the solder heat resistance after moisture absorption can be improved.

In addition, by surface-treating an inorganic filler with an epoxysilane coupling agent, an inorganic filler can be dispersed uniformly by preventing secondary aggregation of a filler, the adhering force to a resin can be strengthened and, at the same time, the resistance to chemicals of a filler having the poor resistance to chemicals can be improved.

In addition, by surface-treating an inorganic filler with an mercaptosilane coupling agent, an inorganic filler can be dispersed uniformly by preventing secondary aggregation of a filler, the adhering force to a resin can be strengthened and, at the same time, the resistance to chemicals of a filler having the poor resistance to chemicals can be improved.

In addition, by setting the content of a phosphorus element at an amount of not less than 0.8% by mass and less than 3.5% by mass relative to the whole resin solids constituent, the nonflammability can be maintained without inclusion of a halogen system compound such as bromine and the like and, at the same time, water absorption can be suppressed and, thus, the heat resistance can be improved.

In addition, by incorporating an inorganic filler, a hardener and other components after 80% or more of a phenolic hydroxy group and an epoxy group are reacted in a reaction of all or a part of a bifunctional epoxy resin and all of a phosphorus compound, a phosphorus compound having a bifunctional phenolic hydroxy group and a bifunctional epoxy resin can be first reacted to assuredly produce a linear polymer compound, and an epoxy resin compound having the improved properties such as the nonflammability, the solder heat resistance after moisture absorption, Tg and the like can be easily obtained.

In addition, by manufacturing an epoxy resin composition by impregnating a glass cloth with the composition and drying and semi-hardening it, a prepreg showing the excellent nonflammability without containing a halogen system compound such as bromine and the like and having the enhanced properties such as the solder heat resistance after moisture absorption, Tg and the like can be obtained.

In addition, by using as a multilayer printed-wiring board, one in which the above prepreg is laminated and molded on an inner layer substrate on which a circuit pattern is formed, the excellent nonflammability is shown without containing a halogen system compound such as bromine and the like and, at the same time, the adhering force between layers and to a metal foil of an inner substrate is not reduced even upon heating and the electric conductivity reliance of a through-hole can be sufficiently maintained in spite of a temperature change after processing of a through-hole.

The disclosure of the priority document, Japanese Application No. 11-335085, filed in Japan on Nov. 25, 1999, is incorporated by reference herein in its entirety.

TABLE 1

|  | Example 1 | | Example 2 | | Example 3 | | Example 4 | | Example 5 | |
| --- | --- | --- | --- | --- | --- | --- | --- | --- | --- | --- |
| Epoxy resin (part by mass) | | | Pre-reacted epoxy | | Pre-reacted epoxy | | Pre-reacted epoxy | | Pre-reacted epoxy | |
|  | Resin 1 | 49 | Resin 1 | 84 | Resin 2 | 70 | Resin 2 | 70 | Resin 2 | 70 |
|  | Resin 7 | 30 | Resin 7 | 30 | Resin 7 | 30 | Resin 7 | 30 | Resin 7 | 30 |
| Phosphorous compounds (part by mass) | Compounds 1 | 21 | included above | | included above | | included above | | included above | |
| Inorganic filler (part by mass) | Filler 2 | 45 | Filler 2 | 45 | Filler 2 | 45 | Filler 2 | 25 | Filler 2 | 80 |
| Hardener (part by mass) | Hardener 1 | 2.9 | Hardener 2 | 3.3 | Hardener 1 | 3.5 | Hardener 1 | 3.5 | Hardener 1 | 3.5 |
| Hardening promoter (part by mass) | 0.1 | | 0.1 | | 0.1 | | 0.1 | | 0.1 | |
| Solvent (part by mass) | Solvent 1 | 25 | Solvent 1 | 25 | Solvent 1 | 25 | Solvent 1 | 25 | Solvent 1 | 25 |
|  | Solvent 2 | 40 | Solvent 2 | 66 | Solvent 2 | 40 | Solvent 2 | 40 | Solvent 2 | 40 |
|  | Solvent 3 | 35 | Solvent 3 | 35 | Solvent 3 | 35 | Solvent 3 | 35 | Solvent 3 | 35 |
| Content of bifunctional epoxy resin (% by mass) (in the whole mass of epoxy resin) | 62% | | 62% | | 62% | | 62% | | 62% | |
| Ratio (a/c) of equivalent (a) of a phenolic hydroxy group of a phosphorous compound and equivalent (c) of an epoxy group of a bifunctional epoxy resin | 0.46 | | 0.46 | | 0.53 | | 0.53 | | 0.53 | |
| Content of phosphorous in resin solids constituent (% by mass) | 2.0 | | 2.0 | | 2.0 | | 2.0 | | 2.0 | |
| Manufacturing process of epoxy resin composition | A process | | B process | | B process | | B process | | B process | |
| Adhering force after blacking process (N/cm) | 8.5 | | 10.0 | | 10.5 | | 10.5 | | 10.5 | |
| Nonflammability (UL 94) | V-0 | | V-0 | | V-0 | | V-0 | | V-0 | |
| Average seconds to flame-out (seconds) | 3.0 | | 1.0 | | 2.5 | | 4.0 | | 2.5 | |
| Water absorption | 0.85 | | 0.75 | | 0.7 | | 0.9 | | 0.52 | |
| Glass transition temperature (Tg) (° C.) | 225 | | 215 | | 205 | | 205 | | 205 | |
| Boiling solder heat resistance (solder at 265° C. for 20 seconds) | | | | | | | | | | |
| Boiled for 2 hours | ○○○○ | | ○○○○ | | ○○○○ | | ○○○○ | | ○○○○ | |
| Boiled for 4 hours | ΔΔΔ× | | ○○○○ | | ○○○○ | | ○○ΔΔ | | ○○○○ | |
| Boiled for 6 hours | Δ××× | | ○ΔΔ× | | ○○Δ× | | Δ××× | | ○ΔΔ× | |
| Thermal coefficient of expansion (ppm/° C.) | 40 | | 40 | | 40 | | 55 | | 32 | |
| Transparency of a molded article | ○ | | ○ | | ○ | | ○ | | Δ | |
| Resistance to chemicals of a molded article | × | | Δ | | Δ | | Δ | | Δ | |

TABLE 2

|  | Example 6 | | Example 7 | | Example 8 | | Example 9 | | Example 10 | |
| --- | --- | --- | --- | --- | --- | --- | --- | --- | --- | --- |
| Epoxy resin (part by mass) | Pre-reacted epoxy | | Pre-reacted epoxy | | Pre-reacted epoxy | | Pre-reacted epoxy | | Pre-reacted epoxy | |
|  | Resin 2 | 70 | Resin 2 | 70 | Resin 2 | 70 | Resin 2 | 70 | Resin 2 | 70 |
|  | Resin 7 | 30 | Resin 7 | 30 | Resin 7 | 30 | Resin 7 | 30 | Resin 7 | 30 |
| Phosphorous compounds (part by mass) | included above | | included above | | included above | | included above | | included above | |
| Inorganic filler (part by mass) | Filler 3 | 45 | Filler 9 | 45 | Filler 5 | 45 | Filler 6 | 45 | Filler 7 | 45 |
| Hardener (part by mass) | Hardener 1 | 3.5 | Hardener 1 | 3.5 | Hardener 1 | 3.5 | Hardener 1 | 3.5 | Hardener 1 | 3.5 |
| Hardening promoter (part by mass) | 0.1 | | 0.1 | | 0.1 | | 0.1 | | 0.1 | |
| Solvent (part by mass) | Solvent 1 | 25 | Solvent 1 | 25 | Solvent 1 | 25 | Solvent 1 | 25 | Solvent 1 | 25 |
|  | Solvent 2 | 40 | Solvent 2 | 40 | Solvent 2 | 40 | Solvent 2 | 40 | Solvent 2 | 40 |
|  | Solvent 3 | 35 | Solvent 3 | 35 | Solvent 3 | 35 | Solvent 3 | 35 | Solvent 3 | 35 |
| Content of bifunctional epoxy resin (% by mass) (in the whole mass of epoxy resin) | 62% | | 62% | | 62% | | 62% | | 62% | |
| Ratio (a/c) of equivalent (a) of a phenolic hydroxy group of a phosphorous compound and equivalent (c) of an epoxy group of a bifunctional epoxy resin | 0.53 | | 0.53 | | 0.53 | | 0.53 | | 0.53 | |
| Content of phosphorous in resin solids constituent (% by mass) | 2.0 | | 2.0 | | 2.0 | | 2.0 | | 2.0 | |
| Manufacturing process of epoxy resin composition | B process | | B process | | B process | | B process | | B process | |
| Adhering force after blacking process (N/cm) | 10.5 | | 10.5 | | 12.5 | | 12.5 | | 13.5 | |
| Nonflammability (UL 94) | V-0 | | V-1 | | V-0 | | V-0 | | V-0 | |
| Average seconds to flame-out (seconds) | 2.5 | | 8.1 | | 3.5 | | 3.0 | | 2.5 | |
| Water absorption | 0.7 | | 0.65 | | 0.7 | | 0.61 | | 0.59 | |
| Glass transition temperature (Tg) (° C.) | 205 | | 205 | | 205 | | 205 | | 205 | |

TABLE 2-continued

|  | Example 6 | Example 7 | Example 8 | Example 9 | Example 10 |
|---|---|---|---|---|---|
| Boiling solder heat resistance (solder at 265° C. for 20 seconds) | | | | | |
| Boiled for 2 hours | ○○○○ | ○○○○ | ○○○○ | ○○○○ | ○○○○ |
| Boiled for 4 hours | ○○○○ | ○○Δ× | ○○○○ | ○○○○ | ○○○○ |
| Boiled for 6 hours | ○Δ×× | ○ΔΔ× | ○○○Δ | ○○○○ | ○○○○ |
| Thermal coefficient of expansion (ppm/° C.) | 40 | 40 | 40 | 38 | 39 |
| Transparency of a molded article | ○ | Δ | Δ | ○ | ○ |
| Resistance to chemicals of a molded article | × | ○ | Δ | ○ | ○ |

TABLE 3

|  | Example 11 | Example 12 | Example 13 | Example 14 | Example 15 |
|---|---|---|---|---|---|
| Epoxy resin (part by mass) | Pre-reacted epoxy Resin 2  70 Resin 7  30 | Pre-reacted epoxy Resin 3  70 Resin 7  30 | Pre-reacted epoxy Resin 4  70 Resin 7  30 | Pre-reacted epoxy Resin 5  70 Resin 7  30 | Pre-reacted epoxy Resin 6  70 Resin 7  30 |
| Phosphorous compounds (part by mass) | included above | included above | included above | included above | included above |
| Inorganic filler (part by mass) | Filler 1  45 | Filler 2  45 | Filler 2  45 | Filler 2  45 | Filler 3  45 |
| Hardener (part by mass) | Hardener 1  3.5 | Hardener 1  3.9 | Hardener 1  2.9 | Hardener 1  2.5 | Hardener 1  3.5 |
| Hardening promoter (part by mass) | 0.1 | 0.1 | 0.1 | 0.1 | 0.1 |
| Solvent (part by mass) | Solvent 1  25 Solvent 2  40 Solvent 3  35 | Solvent 1  25 Solvent 2  40 Solvent 3  35 | Solvent 1  25 Solvent 2  40 Solvent 3  35 | Solvent 1  25 Solvent 2  40 Solvent 3  35 | Solvent 1  25 Solvent 2  40 Solvent 3  35 |
| Content of bifunctional epoxy resin (% by mass) (in the whole mass of epoxy resin) | 62% | 62% | 62% | 62% | 62% |
| Ratio (a/c) of equivalent (a) of a phenolic hydroxy group of a phosphorous compound and equivalent (c) of an epoxy group of a bifunctional epoxy resin | 0.4 | 0.4 | 0.56 | 0.7 | 0.51 |
| Content of phosphorous in resin solids constituent (% by mass) | 2.0 | 2.0 | 2.0 | 2.0 | 1.0 |
| Manufacturing process of epoxy resin composition | B process | B process | B process | B process | B process |
| Adhering force after blacking process (N/cm) | 9.7 | 9.7 | 11.8 | 10.5 | 10.2 |
| Nonflammability (UL 94) | V-0 | V-0 | V-0 | V-0 | V-0 |
| Average seconds to flame-out (seconds) | 2.1 | 2.1 | 2.2 | 2.0 | 4.1 |
| Water absorption | 0.66 | 0.68 | 0.9 | 0.68 | 0.62 |
| Glass transition temperature (Tg) (° C.) | 204 | 240 | 217 | 205 | 213 |
| Boiling solder heat resistance (solder at 265° C. for 20 seconds) | | | | | |
| Boiled for 2 hours | ○○○○ | ○○○○ | ○○○○ | ○○○○ | ○○○○ |
| Boiled for 4 hours | ○○○○ | ○○○○ | ○○○Δ | ○○○○ | ○○○○ |
| Boiled for 6 hours | ○○○Δ | ΔΔΔ× | Δ××× | ○ΔΔ× | ○Δ×× |
| Thermal coefficient of expansion (ppm/° C.) | 37 | 37 | 40 | 40 | 40 |
| Transparency of a molded article | ○ | ○ | ○ | ○ | Δ |
| Resistance to chemicals of a molded article | Δ | Δ | Δ | Δ | Δ |

TABLE 4

|  | Example 16 | Example 17 | Example 18 | Example 19 | Example 20 |
|---|---|---|---|---|---|
| Epoxy resin (part by mass) | Pre-reacted epoxy Resin 7  70 Resin 7  30 | Pre-reacted epoxy Resin 2  70 Resin 6  30 | Pre-reacted epoxy Resin 2  62 Resin 6  38 | Resin 8  49 Resin 7  30 | Pre-reacted epoxy Resin 2  70 Resin 7  30 |
| Phosphorous compounds (part by mass) | included above | included above | included above | Compounds 1  21 | included above |
| Inorganic filler (part by mass) | Filler 5  45 | Filler 2  45 | Filler 2  45 | Filler 2  45 | Filler 2  45 |
| Hardener (part by mass) | Hardener 1  3.1 | Hardener 1  3.0 | Hardener 1  3.3 | Hardener 1  2.9 | Hardener 2  3.5 |
| Hardening promoter (part by mass) | 0.1 | 0.1 | 0.1 | 0.1 | 0.04 |
| Solvent (part by mass) | Solvent 1  25 Solvent 2  40 Solvent 3  35 | Solvent 1  25 Solvent 2  40 Solvent 3  35 | Solvent 1  25 Solvent 2  40 Solvent 3  35 | Solvent 1  25 Solvent 2  40 Solvent 3  35 | Solvent 1  35 Solvent 2  30 Solvent 3  15 |
| Content of bifunctional epoxy resin (% by mass) (in the whole mass of epoxy resin) | 62% | 62% | 53% | 62% | 62% |

TABLE 4-continued

|  | Example 16 | Example 17 | Example 18 | Example 19 | Example 20 |
| --- | --- | --- | --- | --- | --- |
| Ratio (a/c) of equivalent (a) of a phenolic hydroxy group of a phosphorous compound and equivalent (c) of an epoxy group of a bifunctional epoxy resin | 0.53 | 0.53 | 0.53 | 0.5 | 0.53 |
| Content of phosphorous in resin solids constituent (% by mass) | 2.1 | 2.0 | 1.6 | 2.0 | 1.5 |
| Manufacturing process of epoxy resin composition | B process | B process | B process | A process | B process |
| Adhering force after blacking process (N/cm) | 12.5 | 8.1 | 4.1 | 8.5 | 6.1 |
| Nonflammability (UL 94) | V-0 | V-0 | V-1 | V-0 | V-0 |
| Average seconds to flame-out (seconds) | 1.0 | 1.8 | 6.9 | 3.0 | 4.2 |
| Water absorption | 0.41 | 0.64 | 1.35 | 0.71 | 0.61 |
| Glass transition temperature (Tg) (° C.) | 205 | 194 | 208 | 135 | 201 |
| Boiling solder heat resistance (solder at 265° C. for 20 seconds) |  |  |  |  |  |
| Boiled for 2 hours | ○○○○ | ○○○○ | ○○○○ | ○○○○ | ○○○○ |
| Boiled for 4 hours | ○○○○ | ○△△△ | ○△×× | ○○○○ | ○○○○ |
| Boiled for 6 hours | ○○○△ | △△×× | ×××× | ○○△× | ○○○× |
| Thermal coefficient of expansion (ppm/° C.) | 40 | 40 | 40 | 40 | 40 |
| Transparency of a molded article | △ | ○ | ○ | ○ | ○ |
| Resistance to chemicals of a molded article | △ | △ | △ | △ | △ |

TABLE 5

|  | Example 21 | Example 22 | Example 23 | Example 24 | Example 25 |
| --- | --- | --- | --- | --- | --- |
| Epoxy resin (part by mass) | Pre-reacted epoxy Resin 2  70 Resin 7  30 | Pre-reacted epoxy Resin 2  62 Resin 7  38 | Pre-reacted epoxy Resin 2  80 Resin 7  20 | Pre-reacted epoxy Resin 2  70 Resin 7  30 | Pre-reacted epoxy Resin 2  70 Resin 7  30 |
| Phosphorous compounds (part by mass) | included above | included above | included above | included above | included above |
| Inorganic filler (part by mass) | Filler 2  25 | Filler 2  45 | Filler 2  45 | Filler 2  45 | Filler 2  45 |
| Hardener (part by mass) | Hardener 2  35 | Hardener 1  3.5 | Hardener 1  3.5 | Hardener 1  2.5 Hardener 2  10 | Hardener 1  3.5 |
| Hardening promoter (part by mass) | 0.04 | 0.1 | 0.15 | 0.05 | 0.1 |
| Solvent (part by mass) | Solvent 1  35 Solvent 2  50 Solvent 3  15 | Solvent 1  25 Solvent 2  40 Solvent 3  35 | Solvent 1  25 Solvent 2  40 Solvent 3  35 | Solvent 1  25 Solvent 2  40 Solvent 3  35 | Solvent 1  25 Solvent 2  40 Solvent 3  35 |
| Content of bifunctional epoxy resin (% by mass) (in the whole mass of epoxy resin) | 62% | 53% | 74% | 62% | 62% |
| Ratio (a/c) of equivalent (a) of a phenolic hydroxy group of a phosphorous compound and equivalent (c) of an epoxy group of a bifunctional epoxy resin | 0.53 | 0.53 | 0.53 | 0.53 | 0.53 |
| Content of phosphorous in resin solids constituent (% by mass) | 1.5 | 1.6 | 2.3 | 1.8 | 2.0 |
| Manufacturing process of epoxy resin composition | B process | B process | B process | B process | B process |
| Adhering force after blacking process (N/cm) | 5.5 | 6.1 | 12.9 | 8.1 | 12.0 |
| Nonflammability (UL 94) | V-1 | V-1 | V-0 | V-0 | V-0 |
| Average seconds to flame-out (seconds) | 7.5 | 5.8 | 1.1 | 2.5 | 2.7 |
| Water absorption | 0.71 | 1.05 | 0.61 | 0.61 | 0.80 |
| Glass transition temperature (Tg) (° C.) | 201 | 235 | 190 | 205 | 205 |
| Boiling solder heat resistance (solder at 265° C. for 20 seconds) |  |  |  |  |  |
| Boiled for 2 hours | ○○○○ | ○○○○ | ○○○○ | ○○○○ | ○○○○ |
| Boiled for 4 hours | ○○△△ | △△△× | ○○○○ | ○○○○ | ○○○× |
| Boiled for 6 hours | ○△×× | ×××× | ○○○△ | ○○○× | ○××× |
| Thermal coefficient of expansion (ppm/° C.) | 51 | 40 | 40 | 40 | 40 |
| Transparency of a molded article | ○ | ○ | ○ | ○ | △ |
| Resistance to chemicals of a molded article | △ | △ | △ | △ | ○ |

TABLE 6

| | Comparative Example 1 | | Comparative Example 2 | | Comparative Example 3 | | Comparative Example 4 | | Comparative Example 5 | |
|---|---|---|---|---|---|---|---|---|---|---|
| Epoxy resin (part by mass) | Pre-reacted epoxy | | Pre-reacted epoxy | | Pre-reacted epoxy | | Pre-reacted epoxy | | Pre-reacted epoxy | |
| | Resin 2 | 70 | Resin 2 | 70 | Resin 2 | 70 | Resin 2 | 50 | Resin 2 | 50 |
| | Resin 7 | 30 | Resin 7 | 30 | Resin 7 | 30 | Resin 7 | 50 | Resin 6 | 50 |
| Phosphorous compounds (pary by mass) | included above | | included above | | included above | | included above | | included above | |
| Inorganic filler (part by mass) | none | | Filler 4 | 45 | none | | Filler 2 | 45 | Filler 2 | 45 |
| Hardener (part by mass) | Hardener 1 | 3.5 | Hardener 1 | 3.5 | Hardener 2 | 35 | Hardener 1 | 3.5 | Hardener 1 | 3.3 |
| Hardening promoter (part by mass) | 0.1 | | 0.1 | | 0.04 | | 0.1 | | 0.1 | |
| Solvent (part by mass) | Solvent 1 | 25 | Solvent 1 | 25 | Solvent 1 | 35 | Solvent 1 | 25 | Solvent 1 | 25 |
| | Solvent 2 | 40 | Solvent 2 | 40 | Solvent 2 | 50 | Solvent 2 | 40 | Solvent 2 | 40 |
| | Solvent 3 | 35 | Solvent 3 | 35 | Solvent 3 | 15 | Solvent 3 | 35 | Solvent 3 | 35 |
| Content of bifunctional epoxy resin (% by mass) (in the whole mass of epoxy resin) | 62% | | 62% | | 62% | | 41% | | 41% | |
| Ratio (a/c) of equivalent (a) of a phenolic hydroxy group of a phosphorous compound and equivalent (c) of an epoxy group of a bifunctional epoxy resin | 0.53 | | 0.53 | | 0.53 | | 0.53 | | 0.53 | |
| Content of phosphorous in resin solids constituent (% by mass) | 2.0 | | 2.0 | | 1.5 | | 2.0 | | 2.0 | |
| Manufacturing process of epoxy resin composition | B process | | B process | | B process | | B process | | B process | |
| Adhering force after blacking process (N/cm) | 9.5 | | 9.8 | | 3.5 | | 1.5 | | 0.9 | |
| Nonflammability (UL 94) | V-1 | | V-0 | | V-1 | | V-0 | | V-0 | |
| Average seconds to flame-out (seconds) | 7.5 | | 3.5 | | 11.0 | | 2.5 | | 2.3 | |
| Water absorption | 2.2 | | 0.8 | | 1.55 | | 1.5 | | 1.81 | |
| Glass transition temperature (Tg) (° C.) | 204 | | 205 | | 195 | | 235 | | 214 | |
| Boiling solder heat resistance (solder at 265° C. for 20 seconds) | | | | | | | | | | |
| Boiled for 2 hours | ΔΔxx | | ○○○○ | | ΔΔxx | | ΔΔΔΔ | | Δxxx | |
| Boiled for 4 hours | xxxx | | ○ΔΔΔ | | xxxx | | xxxx | | xxxx | |
| Boiled for 6 hours | xxxx | | xxxx | | xxxx | | xxxx | | xxxx | |
| Thermal coefficient of expansion (ppm/° C.) | 69 | | 41 | | 66 | | 40 | | 40 | |
| Transparency of a molded article | ○ | | x | | ○ | | ○ | | ○ | |
| Resistance to chemicals of a molded article | ○ | | x | | ○ | | Δ | | Δ | |

TABLE 7

| | Comparative Example 6 | | Comparative Example 7 | | Comparative Example 8 | | Comparative Example 9 | |
|---|---|---|---|---|---|---|---|---|
| Epoxy resin (part by mass) | Pre-reacted epoxy | | | | | | | |
| | Resin 8 | 70 | Resin 1 | 29 | Resin 1 | 49 | Resin 1 | 43 |
| | Resin 7 | 30 | Resin 6 | 50 | Resin 7 | 30 | Resin 7 | 27 |
| Phosphorous compounds (part by mass) | included above | | Compounds 1 | 21 | none | | Compounds 4 | 30 |
| Inorganic filler (part by mass) | Filler 2 | 45 | Filler 2 | 45 | Filler 2 | 45 | Filler 2 | 45 |
| Hardener (part by mass) | Hardener 1 | 2.3 | Hardener 1 | 3.5 | Hardener 1 | 3.9 | Hardener 1 | 3.9 |
| Hardening promoter (part by mass) | 0.1 | | 0.1 | | 0.1 | | 0.1 | |
| Solvent (part by mass) | Solvent 1 | 25 | Solvent 1 | 25 | Solvent 1 | 25 | Solvent 1 | 25 |
| | Solvent 2 | 40 | Solvent 2 | 40 | Solvent 2 | 40 | Solvent 2 | 40 |
| | Solvent 3 | 35 | Solvent 3 | 35 | Solvent 3 | 35 | Solvent 3 | 35 |
| Content of bifunctional epoxy resin (% by mass) (in the whole mass of epoxy resin) | 58% | | 41% | | 62% | | 62% | |
| Ratio (a/c) of equivalent (a) of a phenolic hydroxy group of a phosphorous compound and equivalent (c) of an epoxy group of a bifunctional epoxy resin | 0.80 | | 0.53 | | — | | — | |
| Content of phosphorous in resin solids constituent (% by mass) | 2.7 | | 2.0 | | 0.0 | | 2.9 | |
| Manufacturing process of epoxy resin composition | B process | | A process | | A process | | A process | |
| Adhering force after blacking process (N/cm) | 10.2 | | 0.5 | | 5.9 | | 4.5 | |
| Nonflammability (UL 94) | V-0 | | V-0 | | HB | | V-1 | |
| Average seconds to flame-out (seconds) | 2.1 | | 3.1 | | 40 | | 12.0 | |
| Water absorption | 1.5 | | 2.2 | | 0.95 | | 2.1 | |
| Glass transition temperature (Tg) (° C.) | 145 | | 221 | | 180 | | 142 | |
| Boiling solder heat resistance (solder at 265° C. for 20 seconds) | | | | | | | | |
| Boiled for 2 hours | ○○○○ | | xxxx | | ○○ΔΔ | | Δxxx | |
| Boiled for 4 hours | ○○○○ | | xxxx | | ΔΔΔX | | xxxx | |

TABLE 7-continued

|  | Comparative Example 6 | Comparative Example 7 | Comparative Example 8 | Comparative Example 9 |
|---|---|---|---|---|
| Boiled for 6 hours | ΔΔΔX | xxxx | xxxx | xxxx |
| Thermal coefficient of expansion (ppm/° C.) | 40 | 40 | 45 | 45 |
| Transparency of a molded article | ○ | Δ | ○ | ○ |
| Resistance to chemicals of a molded article | Δ | x | Δ | x |

What is claimed is:

1. An epoxy resin composition comprising a phosphorus compound component having
   an average per molecule of not less than 1.8 and less than 3 phenolic hydroxy groups reactive with an epoxy resin and
   an average per molecule of not less than 1 phosphorus atom, an inorganic filler having an average particle diameter of not greater than 30 μm, a bifunctional epoxy resin having an average per molecule of not less than 1.8 and less than 2.6 epoxy groups, and a curing agent, wherein
   the epoxy resin composition comprises not less than 51% by mass of the bifunctional epoxy resin,
   the curing agent comprises dicyandiamide, and
   a ratio (a/c) of equivalent (a) of a phenolic hydroxy group of the phosphorus compound component to equivalent (c) of an epoxy group of the bifunctional epoxy resin is not less than 0.3 and less than 0.75.

2. An epoxy resin composition comprising a phosphorus compound component having
   an average per molecule of not less than 1.8 and less than 3 phenolic hydroxy groups reactive with an epoxy resin and
   an average per molecule of not less than 1 phosphorus atom, an inorganic filler having an average particle diameter of not greater than 30 μm, a bifunctional epoxy resin having an average per molecule of not less than 1.8 and less than 2.6 epoxy groups, and a curing agent, wherein
   the epoxy resin composition comprises not less than 51% by mass of the bifunctional epoxy resin,
   the curing agent comprises a polyfunctional phenol system component having an average per molecule of not less than 3 phenolic hydroxy groups, and
   a ratio (a/c) of equivalent (a) of a phenolic hydroxy group of the phosphorus compound component to equivalent (c) of an epoxy group of the bifunctional epoxy resin is not less than 0.3 and less than 0.75.

3. The epoxy resin composition according to claim 1, wherein the phosphorus compound component comprises a compound represented by the following formula (1):

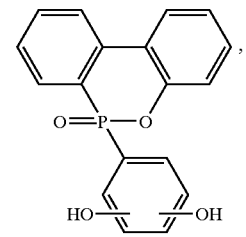

(1)

and the epoxy resin composition comprises not less than 0.8 parts by mass and less than 3.5 parts by mass phosphorus relative to 100 parts by mass of the bifunctional epoxy resin.

4. The epoxy resin composition according to claim 2, wherein the phosphorus compound component comprises a compound represented by the following formula (1):

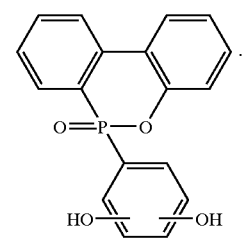

(1)

5. The epoxy resin composition according to claim 1, wherein the phosphorus compound component comprises a compound represented by the following formula (2):

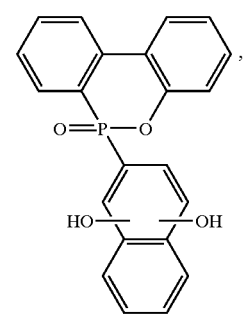

(2)

and the epoxy resin composition comprises not less than 0.8 parts by mass and less than 3.5 parts by mass phosphorus relative to 100 parts of the bifunctional epoxy resin.

6. The epoxy resin composition according to claim 2, wherein the phosphorus compound component comprises a compound represented by the following formula (2):

(2)

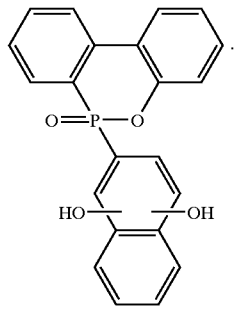

7. The epoxy resin composition according to claim 1, wherein the phosphorus compound component comprises a compound represented by the following formula (3):

(3)

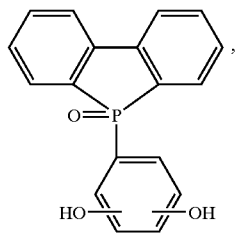

and
the epoxy resin composition comprises not less than 0.8 parts by mass and less than 3.5 parts by mass phosphorus relative to 100 parts of the bifunctional epoxy resin.

8. The epoxy resin composition according to claim 2, wherein the phosphorus compound component comprises a compound represented by the following formula (3):

(3)

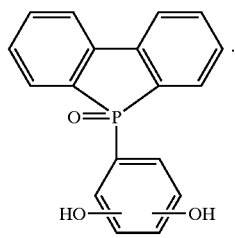

9. The epoxy resin composition according to claim 1, wherein the inorganic filler comprises aluminum hydroxide.

10. The epoxy resin composition according to claim 2, wherein the inorganic filler comprises aluminum hydroxide.

11. The epoxy resin composition according to claim 1, wherein the inorganic filler comprises magnesium hydroxide.

12. The epoxy resin composition according to claim 2, wherein the inorganic filler comprises magnesium hydroxide.

13. The epoxy resin composition according to claim 1, wherein the epoxy resin composition comprises not less than 15 parts by mass and less than 100 parts by mass of the inorganic filler relative to 100 parts by mass of the bifunctional epoxy resin.

14. The epoxy resin composition according to claim 2, wherein the epoxy resin composition comprises not less than 15 parts by mass and less than 100 parts by mass of the inorganic filler relative to 100 parts by mass of the bifunctional epoxy resin.

15. The epoxy resin composition according to claim 1, wherein the bifunctional epoxy resin is a biphenyl-type epoxy resin represented by the following formula (4):

(4)

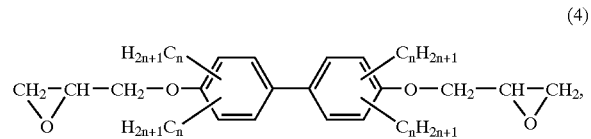

where n=0, 1, 2, 3, 4.

16. The epoxy resin composition according to claim 2, wherein the bifunctional epoxy resin is a biphenyl-type epoxy resin represented by the following formula (4):

(4)

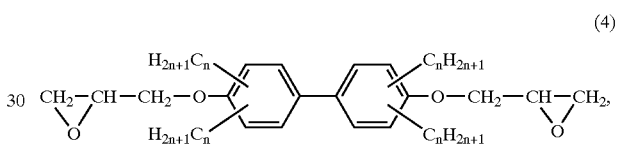

where n=0, 1, 2, 3, 4.

17. The epoxy resin composition according to claim 1, wherein the bifunctional epoxy resin is a naphthalene-type epoxy resin represented by the following formula (5):

(5)

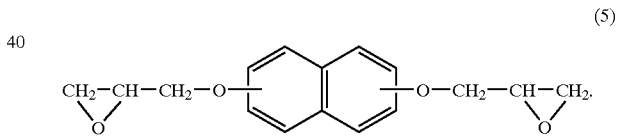

18. The epoxy resin composition according to claim 2, wherein the bifunctional epoxy resin is a naphthalene-type epoxy resin represented by the following formula (5):

(5)

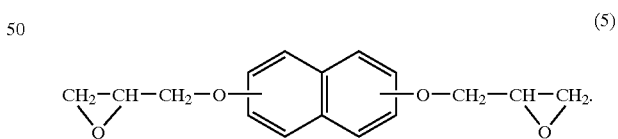

19. The epoxy resin composition according to claim 1, wherein the bifunctional epoxy resin is a special bifunctional epoxy resin represented by the following formula (6):

(6)

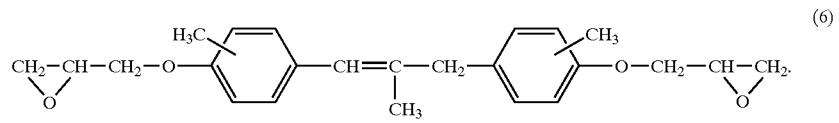

20. The epoxy resin composition according to claim 2, wherein the bifunctional epoxy resin is a special bifunctional epoxy resin represented by the following formula (6):

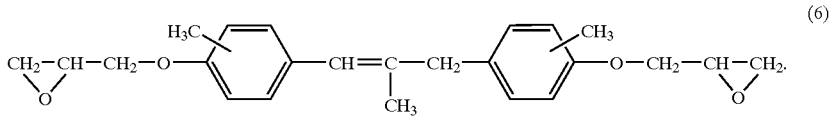

(6)

21. The epoxy resin composition according to claim 1, wherein the bifunctional epoxy resin is a special bifunctional epoxy resin represented by the following formula (7):

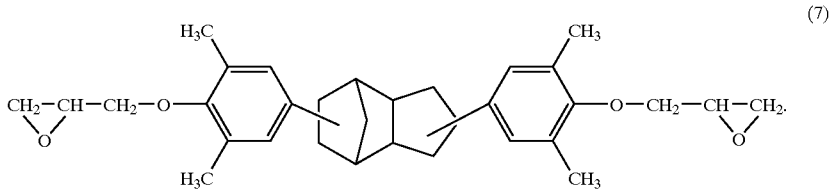

(7)

22. The epoxy resin composition according to claim 2, wherein the bifunctional epoxy resin is a special bifunctional epoxy resin represented by the following formula (7):

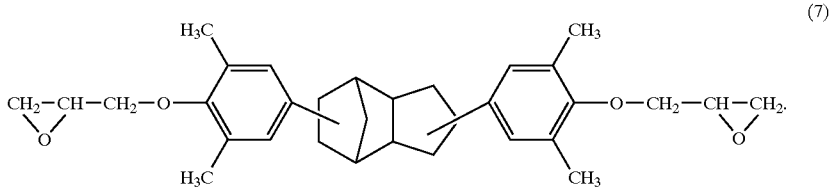

(7)

23. The epoxy resin composition according to claim 1, wherein the inorganic filler is surface-treated with an epoxysilane coupling agent.

24. The epoxy resin composition according to claim 2, wherein the inorganic filler is surface-treated with an epoxysilane coupling agent.

25. The epoxy resin composition according to claim 1, wherein the inorganic filler is surface-treated with a mercaptosilane coupling agent.

26. The epoxy resin composition according to claim 2, wherein the inorganic filler is surface-treated with a mercaptosilane coupling agent.

27. The epoxy resin composition according to claim 1, wherein the epoxy resin composition comprises not less than 0.8 parts by mass and less than 3.5 parts by mass phosphorus relative to 100 parts by mass of the bifunctional epoxy resin.

28. The epoxy resin composition according to claim 2, wherein the epoxy resin composition comprises not less than 0.8 parts by mass and less than 3.5 parts by mass phosphorus relative to 100 parts by mass of the bifunctional epoxy resin.

29. The epoxy resin composition according to claim 1, wherein the epoxy resin composition is produced by a process comprising
  reacting not less than 80% of the phenolic hydroxy group and the epoxy group in a reaction of all or a part of the bifunctional epoxy resin and all of the phosphorus compound component to form a reaction product, and then incorporating the inorganic filler and the curing agent in the reaction product.

30. The epoxy resin composition according to claim 2, wherein the epoxy resin composition is produced by a process comprising
  reacting not less than 80% of the phenolic hydroxy group and the epoxy group in a reaction of all or a part of the bifunctional epoxy resin and all of the phosphorus compound component to form a reaction product, and then incorporating the inorganic filler and the curing agent in the reaction product.

31. A prepreg prepared by a process comprising
  impregnating a glass cloth with the epoxy resin composition as defined in claim 1, and
  drying and semi-hardening the impregnated glass cloth.

32. A prepreg prepared by a process comprising
  impregnating a glass cloth with the epoxy resin composition as defined in claim 2, and
  drying and semi-hardening the impregnated glass cloth.

33. A multilayer printed-wiring board comprising an inner layer substrate having a circuit pattern formed thereon, wherein a prepreg as defined in claim 31 is further laminated and molded thereon.

34. A multilayer printed-wiring board comprising an inner layer substrate having a circuit pattern formed thereon, wherein a prepreg as defined in claim 32 is further laminated and molded thereon.

35. An epoxy resin composition comprising
  a phosphorus compound component having
    an average per molecule of not less than 1.8 and less than 3 phenolic hydroxy groups reactive with an epoxy resin and an average per molecule of not less than 1 phosphorus atom, an inorganic filler having an average particle diameter of not greater than 30 μm, a bifunctional epoxy resin having an average per molecule of not less than 1.8 and less than 2.6 epoxy groups, and a curing agent, wherein the epoxy resin composition comprises not less than 51% by mass of the bifunctional epoxy resin, the curing agent comprises dicyandiamide and a polyfunctional phenol system component having an average per molecule of not less than 3 phenolic hydroxy groups, a ratio (a/c) of equivalent (a) of a phenolic hydroxy group of the phosphorus compound component to equivalent (c) of an epoxy group of the bifunctional epoxy resin is not less than 0.3 and less than 0.75, the inorganic filler comprises aluminum hydroxide, the epoxy resin composition comprises not less than 15 parts by mass and less than 100 parts by mass of the inorganic filler relative to 100 parts by mass of the bifunctional epoxy resin, and the epoxy resin composition comprises not less than 0.8 parts by mass and less than 3.5 parts by mass phosphorus relative to 100 parts by mass of the bifunctional epoxy resin.

* * * * *